United States Patent
Wang et al.

(10) Patent No.: US 9,564,363 B1
(45) Date of Patent: Feb. 7, 2017

(54) METHOD OF FORMING BUTTED CONTACT

(71) Applicant: Taiwan Semiconductor Manufacturing Company, Ltd., Hsin-Chu (TW)

(72) Inventors: Chih-Hao Wang, Hsinchu County (TW); Chun-Hsiung Lin, Hsin-Chu (TW); Chia-Hao Chang, Hsinchu (TW); Jia-Chuan You, Taoyuan County (TW); Wei-Hao Wu, Hsinchu (TW); Yi-Hsiung Lin, Hsin-Chu (TW); Zhi-Chang Lin, Hsinchu County (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/830,217

(22) Filed: Aug. 19, 2015

(51) Int. Cl.
| | |
|---|---|
| H01L 21/00 | (2006.01) |
| H01L 23/52 | (2006.01) |
| H01L 21/768 | (2006.01) |
| H01L 21/8238 | (2006.01) |
| H01L 23/535 | (2006.01) |
| H01L 27/092 | (2006.01) |
| H01L 29/08 | (2006.01) |

(52) U.S. Cl.
CPC ... *H01L 21/76897* (2013.01); *H01L 21/76843* (2013.01); *H01L 21/823814* (2013.01); *H01L 21/823864* (2013.01); *H01L 21/823871* (2013.01); *H01L 23/535* (2013.01); *H01L 27/092* (2013.01); *H01L 29/0847* (2013.01)

(58) Field of Classification Search
CPC .............. H01L 21/76897; H01L 21/76843; H01L 21/823814; H01L 21/823864; H01L 21/823871; H01L 23/535; H01L 27/092; H01L 29/0847
See application file for complete search history.

(56) References Cited

U.S. PATENT DOCUMENTS

| | | | |
|---|---|---|---|
| 7,667,271 | B2 | 2/2010 | Yu et al. |
| 7,910,453 | B2 | 3/2011 | Xu et al. |
| 8,377,779 | B1 | 2/2013 | Wang |
| 8,399,931 | B2 | 3/2013 | Liaw et al. |
| 8,652,894 | B2 | 2/2014 | Lin et al. |
| 8,686,516 | B2 | 4/2014 | Chen et al. |
| 8,716,765 | B2 | 5/2014 | Wu et al. |
| 8,723,272 | B2 | 5/2014 | Liu et al. |
| 8,729,627 | B2 | 5/2014 | Cheng et al. |
| 8,735,993 | B2 | 5/2014 | Lo et al. |
| 8,736,056 | B2 | 5/2014 | Lee et al. |
| 8,772,109 | B2 | 7/2014 | Colinge |
| 8,785,285 | B2 | 7/2014 | Tsai et al. |
| 8,816,444 | B2 | 8/2014 | Wann et al. |

(Continued)

*Primary Examiner* — Nicholas Tobergte
(74) *Attorney, Agent, or Firm* — Haynes and Boone, LLP

(57) ABSTRACT

A method of fabricating a semiconductor device is disclosed. The method includes forming a first gate structure over a substrate, forming a source/drain feature in the substrate adjacent the first gate structure, forming a dielectric layer over the first gate structure and the source/drain feature, removing a portion of the dielectric layer to form a first trench exposing the first gate structure and the source/drain feature, forming a first conductive feature in the first trench, removing a first portion of the first gate structure to form a second trench and forming a second conductive feature in the second trench.

20 Claims, 15 Drawing Sheets

(56) References Cited

U.S. PATENT DOCUMENTS

| | | | |
|---|---|---|---|
| 8,823,065 B2 | 9/2014 | Wang et al. | |
| 8,850,369 B2 * | 9/2014 | Lung | G03F 1/70 |
| | | | 257/E21.267 |
| 8,860,148 B2 | 10/2014 | Hu et al. | |
| 8,952,547 B2 * | 2/2015 | Liaw | H01L 27/11 |
| | | | 257/775 |
| 9,159,827 B2 * | 10/2015 | Cheng | H01L 21/2815 |
| 9,337,083 B2 * | 5/2016 | Shieh | H01L 21/76895 |
| 9,412,700 B2 * | 8/2016 | Hsieh | H01L 23/535 |
| 2007/0284661 A1 * | 12/2007 | Yamada | H01L 21/84 |
| | | | 257/347 |
| 2012/0217570 A1 * | 8/2012 | Kim | H01L 27/10876 |
| | | | 257/324 |
| 2013/0280909 A1 * | 10/2013 | Lung | G03F 1/70 |
| | | | 438/692 |
| 2014/0001574 A1 | 1/2014 | Chen et al. | |
| 2014/0110755 A1 | 4/2014 | Colinge | |
| 2014/0151812 A1 | 6/2014 | Liaw | |
| 2016/0118350 A1 * | 4/2016 | Lin | H01L 23/481 |
| | | | 257/632 |

\* cited by examiner

METHOD OF FORMING BUTTED CONTACT

BACKGROUND

The semiconductor integrated circuit (IC) industry has experienced rapid growth. Technological advances in IC design and material have produced generations of ICs where each generation has smaller and more complex circuits than previous generations. In the course of IC evolution, functional density (i.e., the number of interconnected devices per chip area) has generally increased while geometry size (i.e., the smallest component (or line) that can be created using a fabrication process) has decreased.

This scaling down process generally provides benefits by increasing production efficiency and lowering associated costs. Such scaling down has also increased the complexity of IC processing and manufacturing. For these advances to be realized, similar developments in IC processing and manufacturing are needed. One area is the wiring, or interconnects, between the transistors and other devices. Although existing methods of fabricating IC devices have been generally adequate for their intended purposes, they have not been entirely satisfactory in all respects. For example, challenges rise to develop robust process for forming butted contacts, namely the contacts that connect a gate electrode to a source/drain feature.

BRIEF DESCRIPTION OF THE DRAWINGS

Aspects of the present disclosure are best understood from the following detailed description when read in association with the accompanying figures. It is noted that, in accordance with the standard practice in the industry, various features in drawings are not drawn to scale. In fact, the dimensions of illustrated features may be arbitrarily increased or decreased for clarity of discussion.

DETAILED DESCRIPTION

Figure 1:
FIG. 1 is a flowchart of an example method for fabricating a semiconductor device constructed in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a flowchart of a method 100 of fabricating one or more semiconductor devices in accordance with some embodiments. The method 100 is discussed in detail below, with reference to an initial structure 205 of a semiconductor device 200 showed in FIG. 2 and the semiconductor device 200 shown in FIGS. 3 through 11B.

Figure 2:
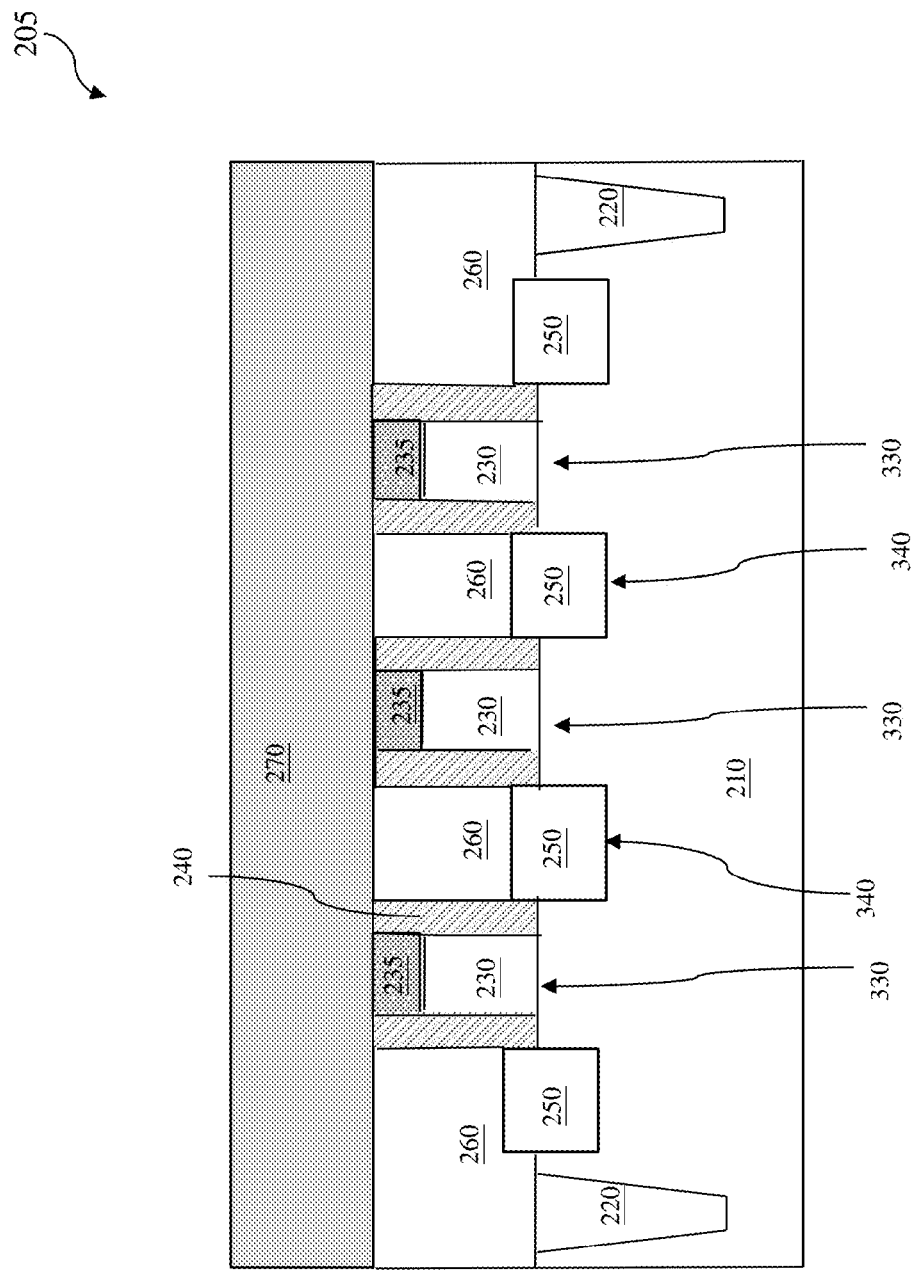
FIGS. 2, 3, 4, 5, 6, 7, 8, 9A, 9B, 10A, 10B, 10C, 11A and 11B are cross-sectional views of an example semiconductor device in accordance with some embodiments.

Referring to FIGS. 1 and 2, the method 100 starts at step 102 by receiving the initial structure 205 of the semiconductor device 200. The initial structure 205 includes a substrate 210. The substrate 210 may be a bulk silicon substrate. Alternatively, the substrate 210 may comprise an elementary semiconductor, such as silicon or germanium in a crystalline structure; a compound semiconductor, such as silicon germanium, silicon carbide, gallium arsenic, gallium phosphide, indium phosphide, indium arsenide, and/or indium antimonide; or combinations thereof. Possible substrates 210 also include a silicon-on-insulator (SOI) substrate. SOI substrates are fabricated using separation by implantation of oxygen (SIMOX), wafer bonding, and/or other suitable methods.

Some exemplary substrates 210 also include an insulator layer. The insulator layer comprises any suitable material, including silicon oxide, sapphire, and/or combinations thereof. An exemplary insulator layer may be a buried oxide layer (BOX). The insulator is formed by any suitable process, such as implantation (e.g., SIMOX), oxidation, deposition, and/or other suitable process. In some exemplary initial structure 205, the insulator layer is a component (e.g., layer) of a silicon-on-insulator substrate.

The substrate 210 may also include various doped regions. The doped regions may be doped with p-type dopants, such as boron or $BF_2$; n-type dopants, such as phosphorus or arsenic; or combinations thereof. The doped regions may be formed directly on the substrate 210, in a P-well structure, in an N-well structure, in a dual-well structure, or using a raised structure. The substrate 210 may further include various active regions, such as regions configured for an N-type metal-oxide-semiconductor transistor device and regions configured for a P-type metal-oxide-semiconductor transistor device.

The substrate 210 may also include various isolation features 220. The isolation features 220 separate various device regions in the substrate 210. The isolation features 220 include different structures formed by using different processing technologies. For example, the isolation features 220 may include shallow trench isolation (STI) features. The formation of a STI may include etching a trench in the substrate 210 and filling in the trench with insulator materials such as silicon oxide, silicon nitride, or silicon oxynitride. The filled trench may have a multi-layer structure such as a thermal oxide liner layer with silicon nitride filling the trench. A chemical mechanical polishing (CMP) may be performed to polish back excessive insulator materials and planarize the top surface of the isolation features 220.

The initial structure 205 also includes a plurality of first conductive features 230 over the substrate 210. In some embodiments, the first conductive feature 230 may be gate structures including high-k/metal gate stacks (HK/MGs). Alternatively, in some embodiment, the first conductive feature 230 may also include a portion of the interconnect structure, such as a contact, a metal via, and/or metal line. In one embodiment, the first conductive features 230 include electrodes, capacitors, resistors and/or a portion of a resistor. For the purpose of simplicity and clarity, the first conductive feature 230 is referred to as the HK/MG 230.

The HK/MGs 230 may include gate dielectric layer and MG electrode layer. The gate dielectric layer of HK/MGs 230 may include LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), or other suitable materials. The gate dielectric layers may be deposited by a suitable method, such as chemical vapor deposition (CVD), atomic layer deposition (ALD), thermal oxidation or ozone oxidation, other suitable technique, or a combination thereof.

The MG electrode layer may include a single layer or multi layers, such as a metal layer, a liner layer, a wetting layer, and an adhesion layer. The MG may include Ti, Ag, Al, TiAlN, TaC, TaCN, TaSiN, Mn, Zr, TiN, TaN, Ru, Mo, Al, WN, Cu, W, or any suitable materials. The MG may be formed by ALD, physical vapor deposition (PVD), CVD, or other suitable process.

In some embodiment, dummy gate stacks are formed first and then are replaced later by HK/MGs 230 after high thermal temperature processes are performed, such as thermal processes during sources/drains formation. The dummy gate stack may include a dummy gate dielectric layer and a polysilicon layer and may be formed by deposition, patterning and etching processes.

In the present embodiment, a first hard mask (HM) 235 is formed on top of each of the HK/MGs 230. The first HM 235 may include titanium (Ti), titanium oxide, TiN, TiSiN, tantalum (Ta), tantalum oxide, TaN, TaSiN, silicon nitride, silicon oxide, silicon carbide, silicon carbide nitride, manganese (Mn), cobalt (Co), ruthenium (Ru), WN, aluminum nitride, aluminum oxide, and/or other suitable material. The first HM 235 may be formed by deposition, lithography patterning and etch processes.

In some embodiment, sidewall spacers 240 may be formed along the sidewalls of the HK/MGs 230. The sidewall spacers 240 may include a dielectric material such as silicon nitride. Alternatively, the sidewall spacers 240 may include silicon carbide, silicon oxynitride, and/or other suitable material. The sidewall spacers 240 may be formed by depositing a gate sidewall spacer layer and then anisotropic dry etching the gate sidewall spacer layer.

The initial structure 205 also may include second conductive features 250 over the substrate 210. A top surface of the second conductive feature 250 may not be at same horizontal level as the first conductive feature 230. For example, the top surface of the second conductive feature 250 is substantial below the top surface of the first conductive feature 230. The second conductive feature 250 may be formed by processes such as deposition, photolithography and etch.

In some embodiments, the second conductive features 250 are source/drain (S/D) features, beside and separated by the HK/MG 230. Alternatively, in some embodiment, the second conductive feature 250 may also include a portion of the interconnect structure, such as a contact, metal via, or metal line. In one embodiment, the first conductive features 250 include electrodes, capacitors, resistors or a portion of a resistor. For the purpose of simplicity and clarity, the second conductive feature 230 is referred to as the S/D features 230 hereinafter.

Here, one of the S/D features 250 is a source feature and another of the S/D features 250 is a drain feature. As shown, the S/D features 250 are separated by the HK/MG 230. In one embodiment, a portion of the substrate 210, beside the HK/MG 230 is recessed to form S/D recesses and then the S/D features 250 are formed over the S/D recesses by epitaxial growing processes, such as CVD, VPE and/or UHV-CVD, molecular beam epitaxy, and/or other suitable processes.

The S/D features 250 may include germanium (Ge), silicon (Si), gallium arsenide (GaAs), aluminum gallium arsenide (AlGaAs), silicon germanium (SiGe), gallium arsenide phosphide (GaAsP), gallium antimony (GaSb), indium antimony (InSb), indium gallium arsenide (InGaAs), indium arsenide (InAs), or other suitable materials.

The S/D features 250 may be formed by epitaxial growing processes, such as CVD deposition techniques (e.g., vapor-phase epitaxy (VPE) and/or ultra-high vacuum CVD (UHV-CVD)), molecular beam epitaxy, and/or other suitable processes. After the S/D recesses are filled with the S/D feature 250, further epitaxial growth of a top layer of the S/D features 250 expands horizontally and facets may start to form, such as a diamond shape facets. The S/D features 250 may be in-situ doped during the epi processes. For example, in one embodiment, the S/D feature 250 includes an epitaxially grown SiGe layer that is doped with boron. In another embodiment, the S/D feature 250 includes an epitaxially grown Si epi layer that is doped with carbon. In yet another embodiment, the S/D feature 250 includes an epitaxially grown Si epi layer that is doped with phosphorous. In one embodiment, the S/D feature 250 is not in-situ doped, an implantation process (i.e., a junction implant process) is performed to dope the S/D feature 250. One or more annealing processes may be performed to activate dopants. The annealing processes comprise rapid thermal annealing (RTA) and/or laser annealing processes.

In the present embodiment, the initial structure 205 includes a first dielectric layer 260 deposited over the substrate 210. As shown, first dielectric layer 260 is formed such that it fully fills in spaces between HK/MGs 230 and such that the S/D features 250 are embedded in the first dielectric layer 260. The first dielectric layer 260 may include silicon oxide, a dielectric material having a dielectric constant (k) lower than thermal silicon oxide (therefore referred to as low-k dielectric material layer), and/or other suitable dielectric material layer. The first dielectric layer 260 may include a single layer or multiple layers. The first dielectric layer 260 may be deposited by CVD, ALD or spin-on coating.

The initial structure 205 also may include a second dielectric layer 270 over the first dielectric layer 260. The second dielectric layer 270 may include silicon oxide, a low-k dielectric material, and/or other suitable dielectric material layer. The second dielectric layer 270 may include a single layer or multiple layers. The second dielectric layer 270 is formed similarly in many respects to the first dielectric layer 260 discussed above.

In the present embodiment, both the first and second dielectric layers, 260 and 270, are different from the sidewall spacer 240 and the first hard mask 235 to achieve etching selectivity during a subsequent etch as described in more detail below. For example, in one embodiment, both the first and second dielectric layers, 260 and 270, include silicon oxide while both of the sidewall spacer 240 and the first hard mask 235 include silicon nitride.

Figure 3:
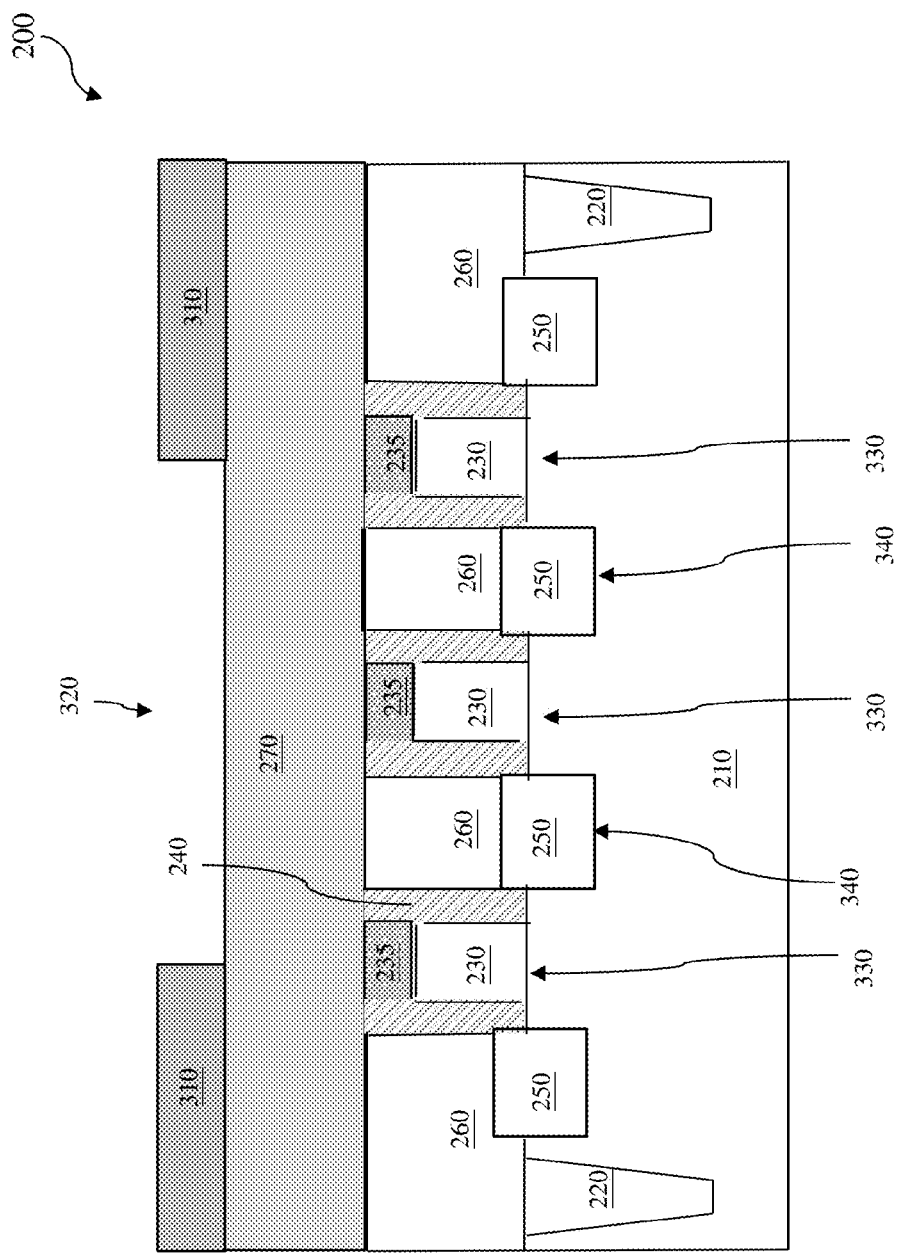

Referring to FIGS. 1 and 3, once the initial structure 205 is received, the method of 100 proceeds to step 104 by forming a second HM 310 having a first opening 320 over the second dielectric layer 270. In some embodiments, a subset 330 of HK/MGs 230 and a subset 340 of the S/D features 250 are within first opening 320. As shown, first opening 320 has a larger width such that it extends to the subset 330 of HK/MGs 230 and the subset 340 of the S/D feature 250 to obtain advantages, such as relaxing lithography process resolution constrains.

In one embodiment, the second HM 310 is a patterned photoresist layer. In another embodiment, the second HM 310 is formed by depositing a sub-HM layer over the second dielectric layer 270, depositing photoresist layer over the sub-HM layer, patterning the photoresist layer, then etching the sub-HM layer through patterned photoresist layer to pattern the sub-HM layer and then etching the second HM 310 through the patterned sub-HM layer to form the first opening 320 in the second HM 310.

Figure 4:
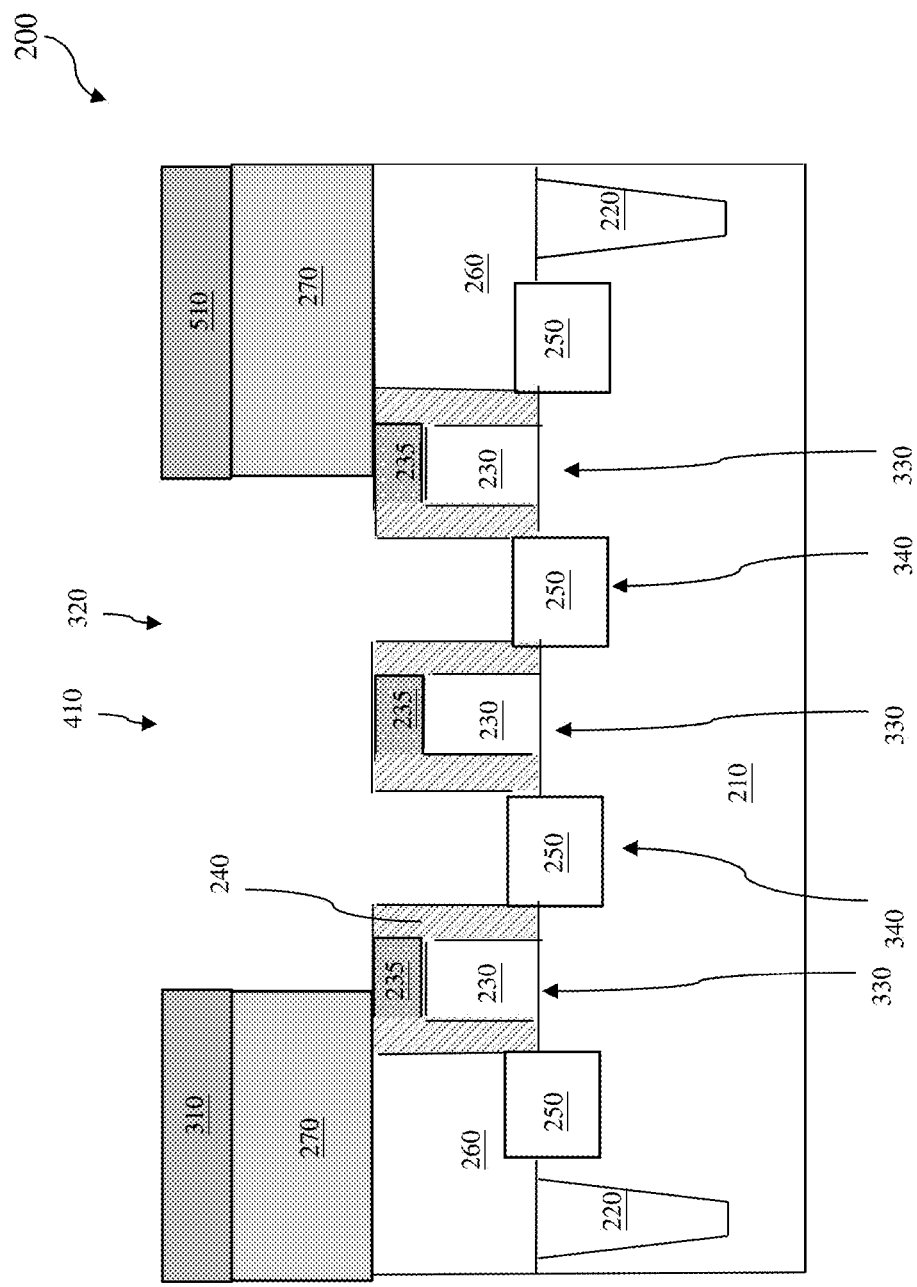

Referring to FIGS. 1 and 4 the method 100 proceeds to step 106 by etching the second and first dielectric layers, 270 and 260, through the opening 320 to form a first trench 410. In some embodiments, the second and first dielectric layers, 270 and 260, between etch of the HK/MGs 230 of the subset 330 are removed and the subset 340 of the S/D features 250 is exposed in the first trench 410. Therefore, the first trench 410 is sometimes referred as to a S/D contact trench. As has been mentioned previously, the trench etch process is properly chosen to selectively remove the second and the first dielectric layers, 270 and 260, but does not substantially etch the first HM 235 and the sidewall spacer 240. Accordingly, the subset 330 of the HK/MG 230 is protected by the first HM 235 and the sidewall spacers 240 during the etching process. With the adequate etch selectivity, the first trench 410 is formed with a self-alignment nature, which relaxes process constrains.

The trench etch may include a selective wet etch, a selective dry etch, and/or a combination thereof. As an example, the trench etch includes a plasma dry etching process using a fluorine-based chemistry, such as $CF_4$, $SF_6$, $CH_2F_2$, $CHF_3$, and/or $C_2F_6$. The respective etch process may be tuned with various etching parameters, such as etchant used, etching temperature, etching solution concentration, etching pressure, etchant flow rate, and/or other suitable parameters.

After forming the first trench 410, the second HM 310 is removed by an etch process. In one example where the second HM 310 is a photoresist pattern, the second HM 310 is removed by wet stripping and/or plasma ashing.

Figure 5:
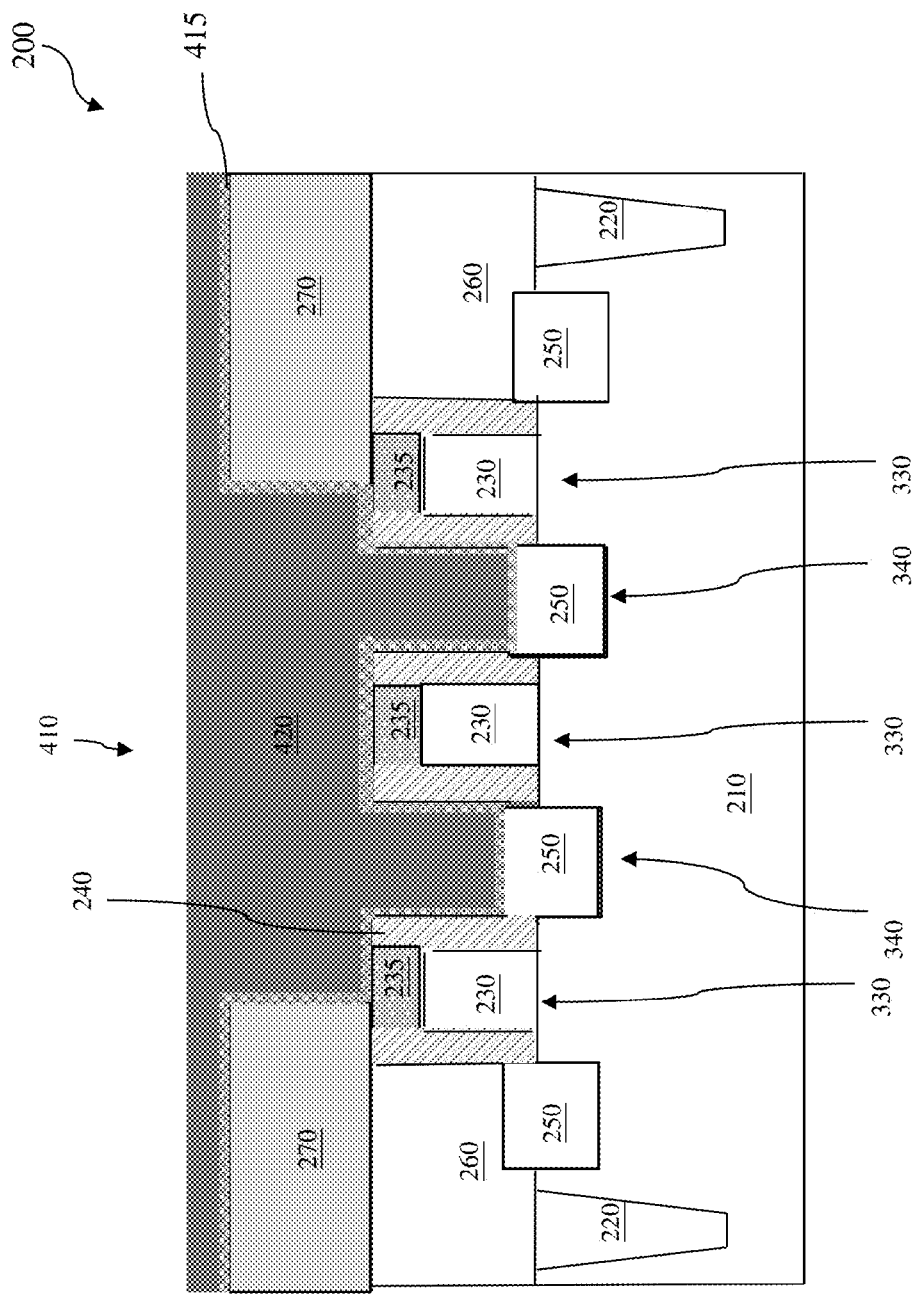

Referring to FIGS. 1 and 5, the method 100 proceeds to step 108 by depositing a first conductive layer 420 in the first trench 410. As shown, first conductive layer 420 extends within first trench 410 toward S/D features 250 of subset 340. Prior to depositing the first conductive layer 420, a first barrier layer 415 is deposited in the first trench 410 to prevent out-diffusion and/or provide material adhesion. The first barrier layer 415 extends within first trench 410 toward S/D features 250 of subset 340. The first barrier layer 415 may include titanium nitride (TiN), tantalum nitride (TaN), tungsten nitride (WN), titanium silicon nitride (TiSiN) or tantalum silicon nitride (TaSiN). The first conductive layer 420 may include metal layer, such as copper (Cu), aluminum (Al), tungsten (W), copper, copper magnesium (CuMn), copper aluminum (CuAl) or copper silicon (CuSi), or other suitable conductive material. The first barrier layer 415 and the first conductive layer 420 may be deposited by PVD, CVD, metal-organic chemical vapor deposition (MOCVD), or plating.

Figure 6:
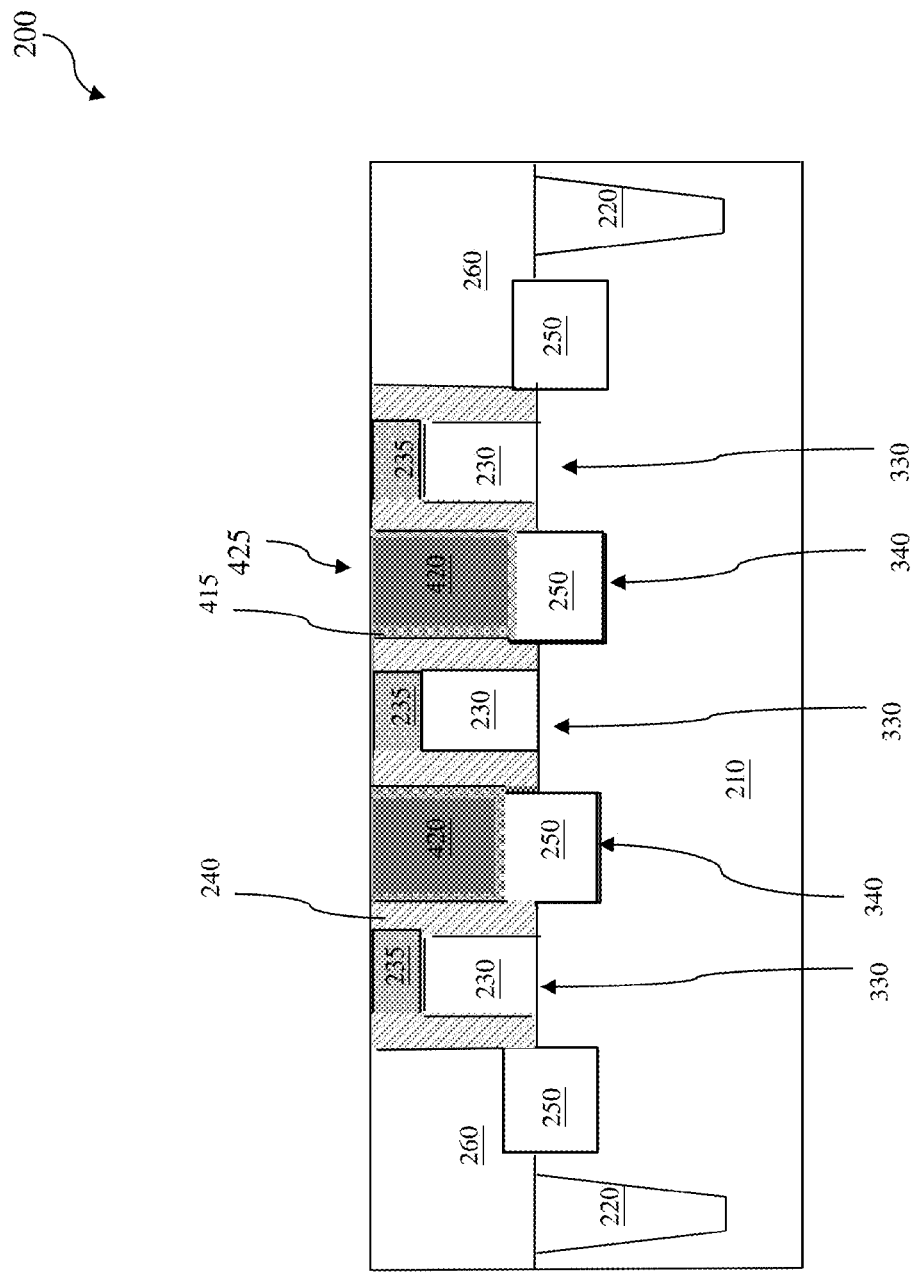

Referring to FIGS. 1 and 6, the method 100 proceeds to step 110 by recessing the first conductive layer 420, as well as the second dielectric layer 270, to provide a planar topography for subsequent processes, such as a lithography process. In some embodiments, a CMP process is performed to remove excessive first conductive layer 420 and the second dielectric layer 270. The remaining first conductive layer 420 in the first trench 410 forms a first conductive feature 425, which has the first barrier layer 415 along its sidewalls. The first conductive feature is separated from the adjacent HK/MGs 230 by the sidewall spacer 240 and first barrier layer 415.

Figure 7:
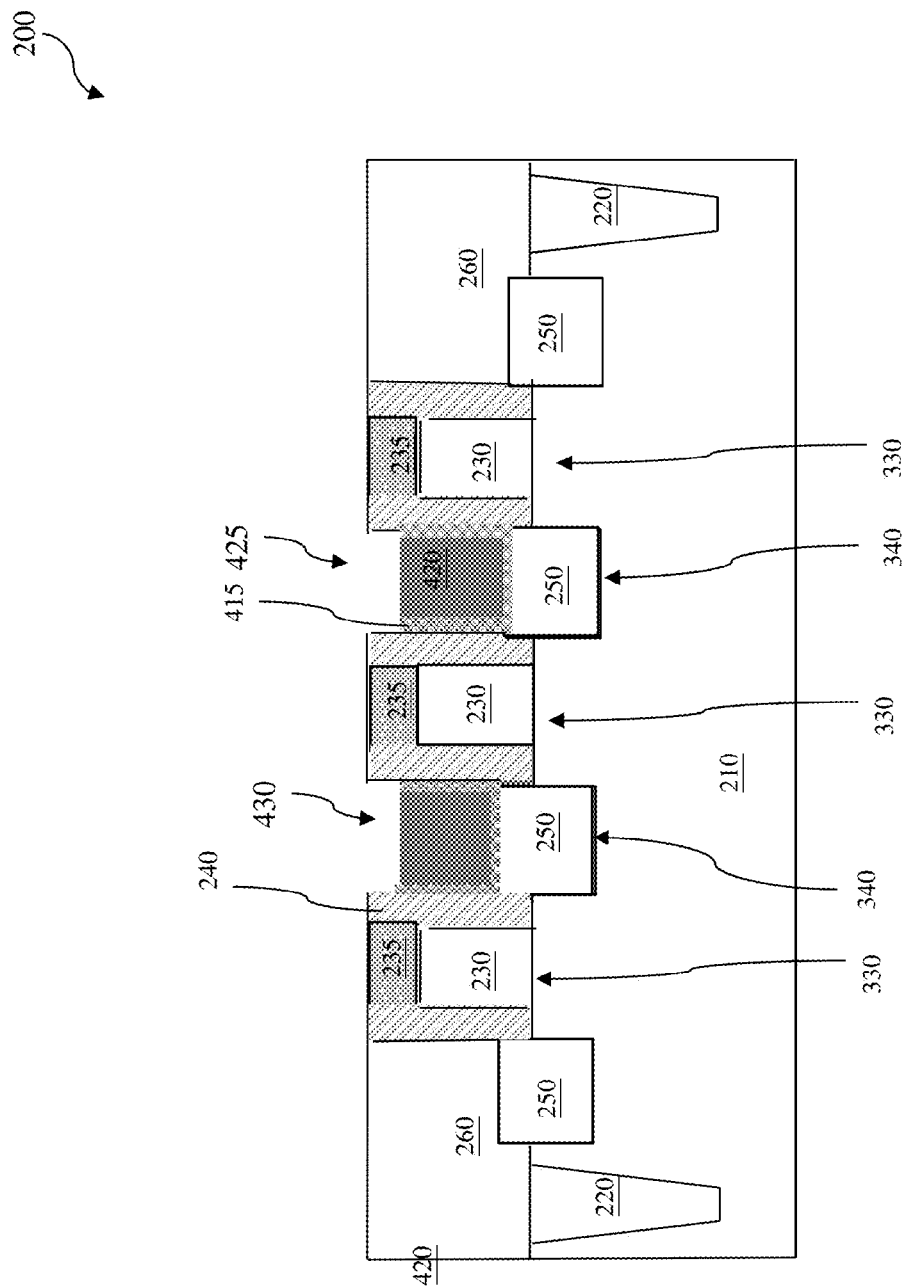

Referring to FIGS. 1 and 7, the method 100 proceeds to step 112 by recessing the first conductive feature 425 to form a sub-trench 430. In some embodiments, the first conductive feature 425 is recessed by a selective etch, which etches the first conductive feature 425 and first barrier layer 415 without substantially etching the sidewall spacers 240, the first HM 235 and the first dielectric layer 260.

Figure 8:
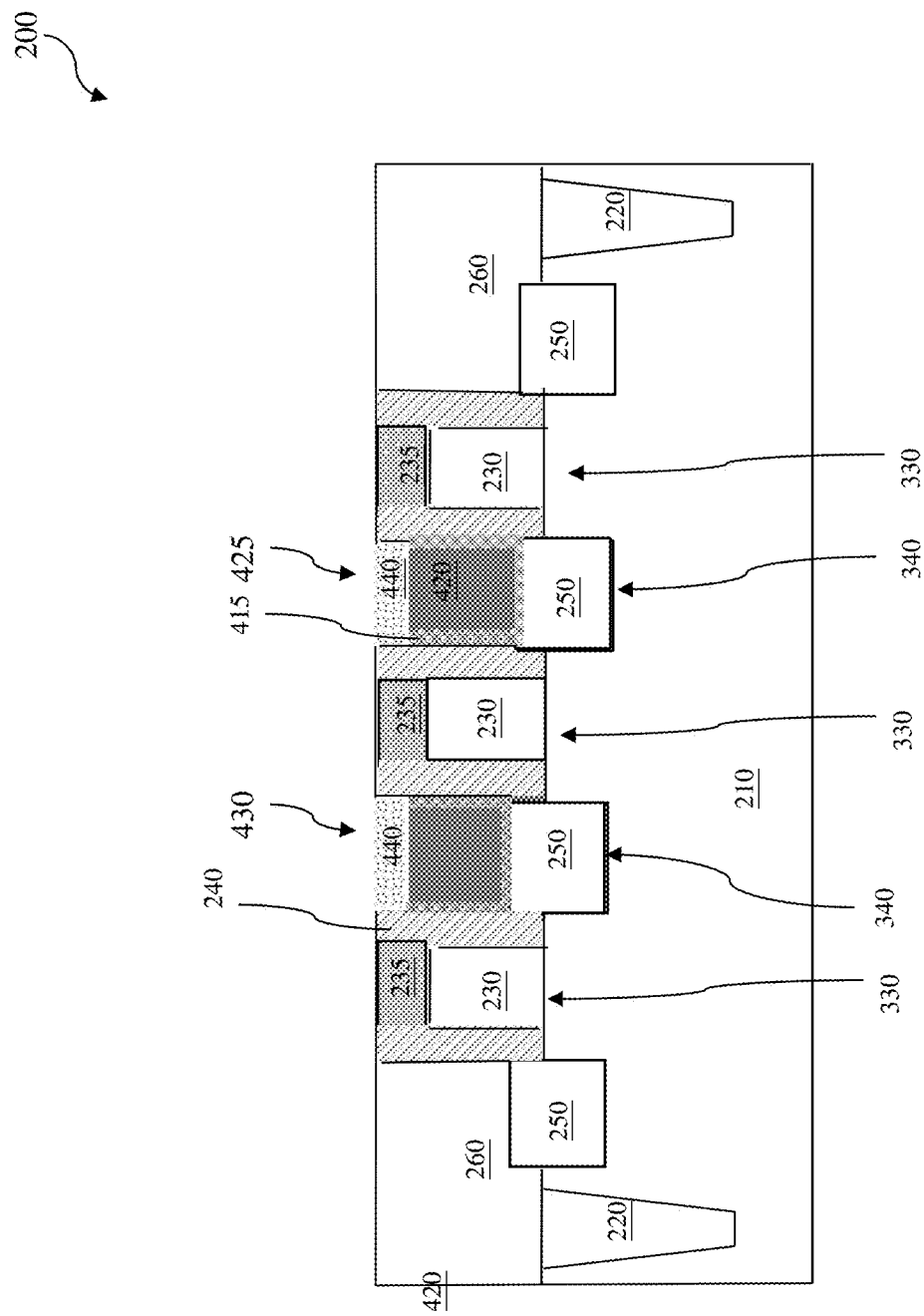

Referring to FIGS. 1 and 8, the method 100 proceeds to step 114 by forming a third HM 440 over the remaining first conductive feature 425 within the sub-trench 430. The third HM 440 may include Ti, titanium oxide, TiN, TiSiN, Ta, tantalum oxide, TaN, TaSiN, silicon nitride, silicon oxide, silicon carbide, silicon carbide nitride, and/or other suitable material. In some embodiments, a material of the third HM 440 is different from the sidewall spacer 240 and the first hard mask 235 to achieve etching selectivity during a subsequent etch as described in more detail below. The third HM 440 may be formed by filling in the sub-trench 430 with a HM layer and applying a CMP process to remove excessive the HM layer.

Figure 9A:
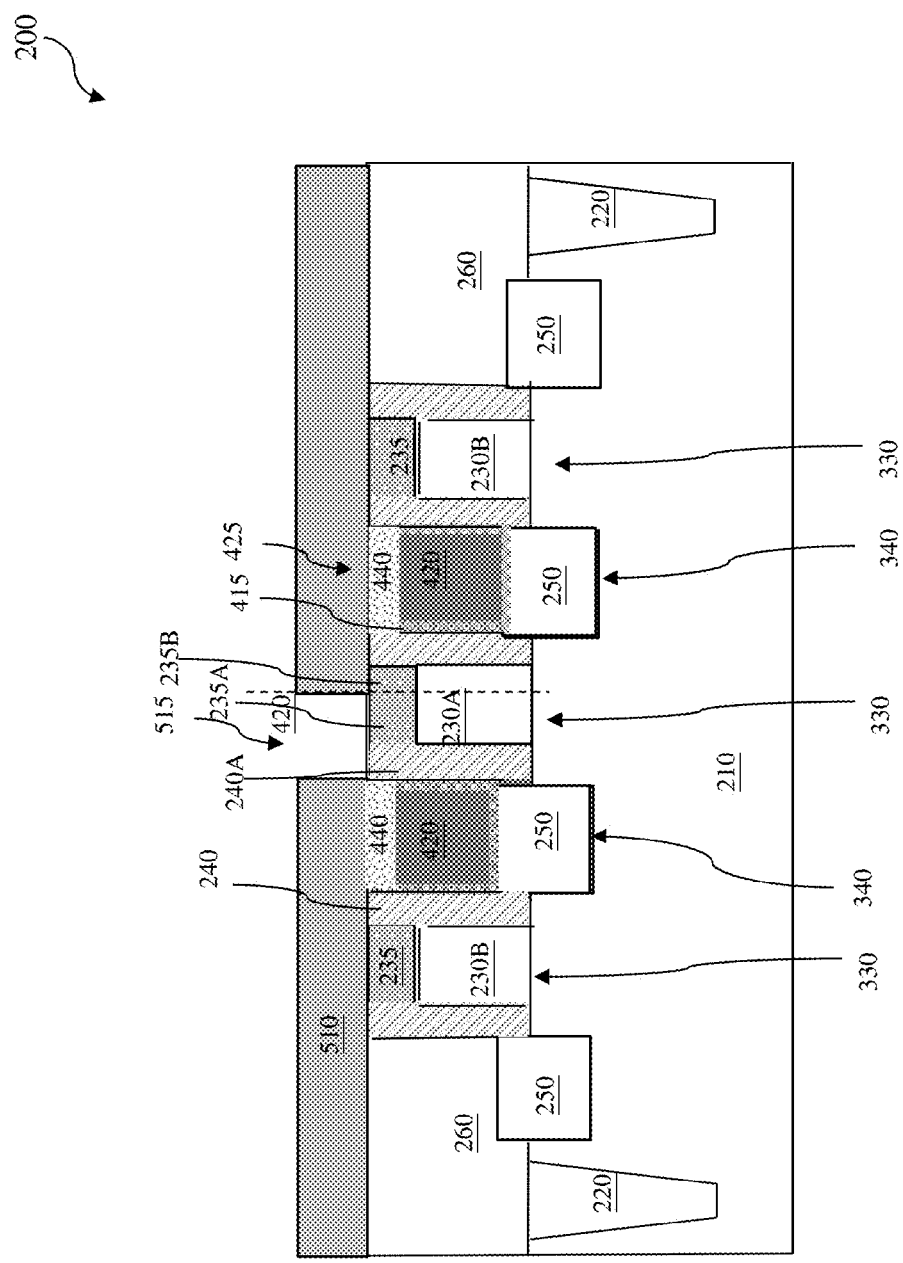

Referring to FIGS. 1 and 9A, the method 100 proceeds to step 116 by forming a fourth HM 510 over the first dielectric layer 260, the HK/MGs 230 and the first conductive feature 425. As shown, fourth HM 510 defines a second opening 515 that exposes the sidewall spacer 240 (referred to as 240A) a first portion of the first HM 235 of one of the HK/MG 230 of the subset 330 (referred to as 235A and 230A, respectively), while a second portion of the first HM 235 of the HK/MGs 230A is covered by the fourth HM 510, referred to as 235B. The rest of HK/MGs 230 of the subset 330, referred to as HK/MGs 230B, are covered by the fourth HM 510 as well. A first portion of the first HM 235, referred to as 235A is exposed within the second opening 515 as well. The fourth HM 510 may be formed similarly in many respects to the second HM 310 discussed above association with FIG. 3. In one embodiment, the fourth HM 510 is a patterned photoresist layer formed by lithography process.

Figure 9B:
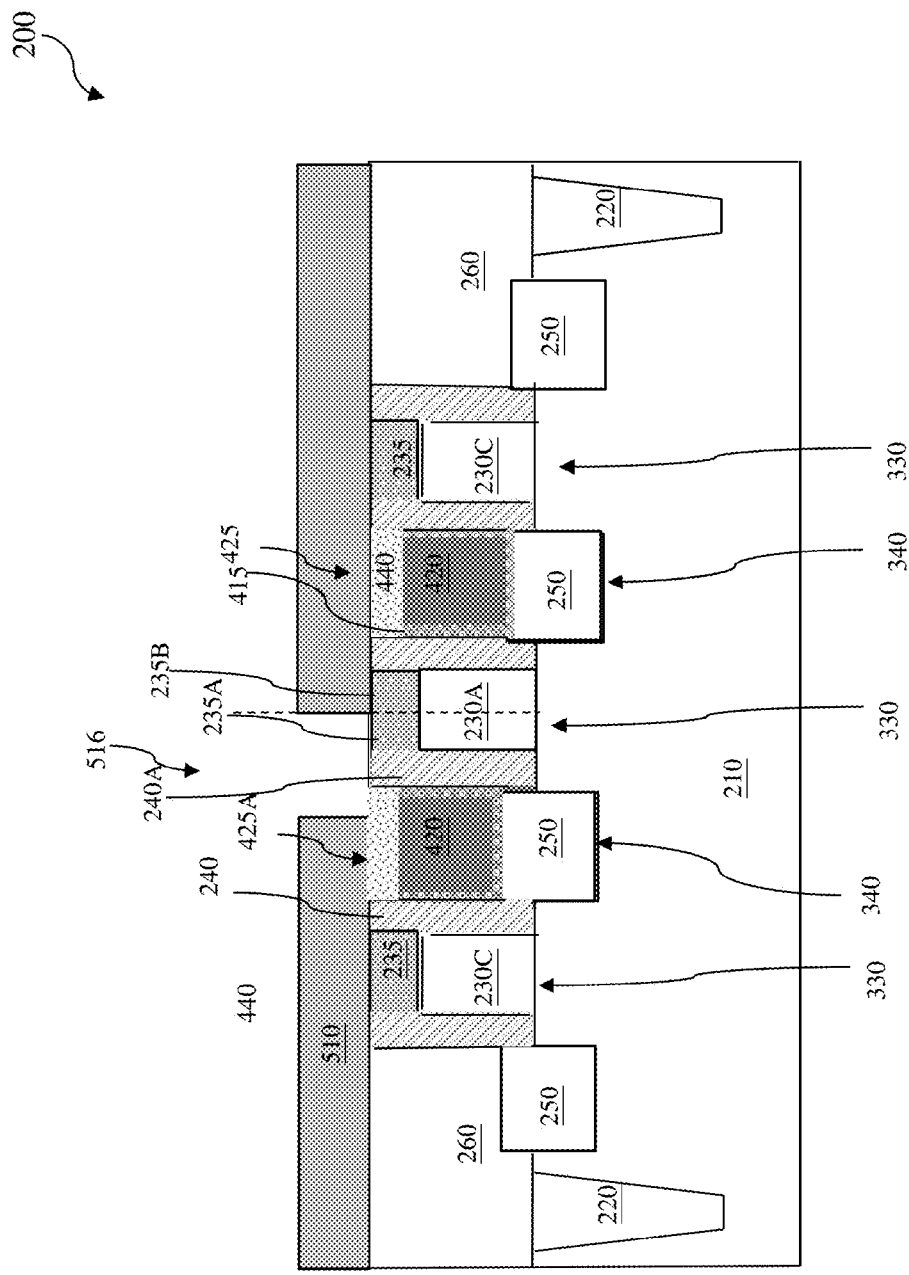

Alternatively, in some embodiments, the fourth HM 510 defines a second opening that is wider than the one shown in FIG. 9A. For example, referring to FIG. 9B, a portion of the first conductive feature 425, as well as the respective third HM 440, adjacent to the HK/MG 230A, referred to as first conductive feature 425A, is exposed within the second opening (referred to as 516 as shown in FIG. 9B) defined by the fourth HM 510. In still other embodiments, the second opening 516 has a larger width such that it extends to the adjacent first conductive feature 425A to obtain advantages, such as relaxing lithography process resolution constrains.

Figure 10A:
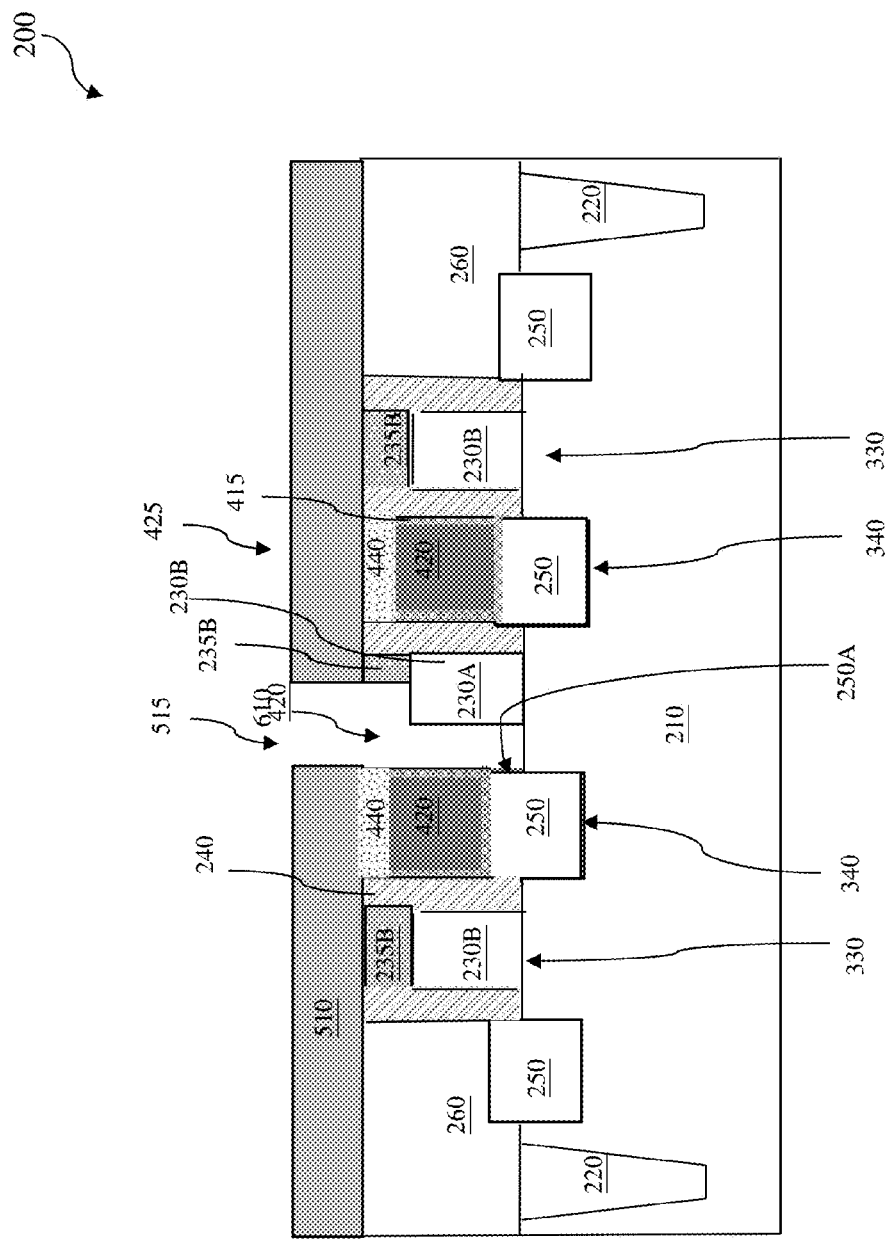

Referring to FIGS. 1 and 10A (in conjunction with the process described with respect to FIG. 9A), method 100 proceeds to step 118 by removing the first portion of first HM 235A and the exposed sidewall spacer 240A through the second opening 515 to form a second trench 610. The etch process is chosen to selectively remove the sidewall spacer 240A and the first portion 235A of the first HM 235 without substantially etching the HK/MG 230A. As shown, the second trench 610 is formed such that the second portion 235B, a portion of the HK/MG 230A and a portion 250A of the adjacent S/D feature 250 are exposed in the second trench 610. Therefore, the second trench 610 is sometimes referred to as a butted contact trench. The etch process may include wet etch, dry etch, or a combination thereof.

Figure 10B:
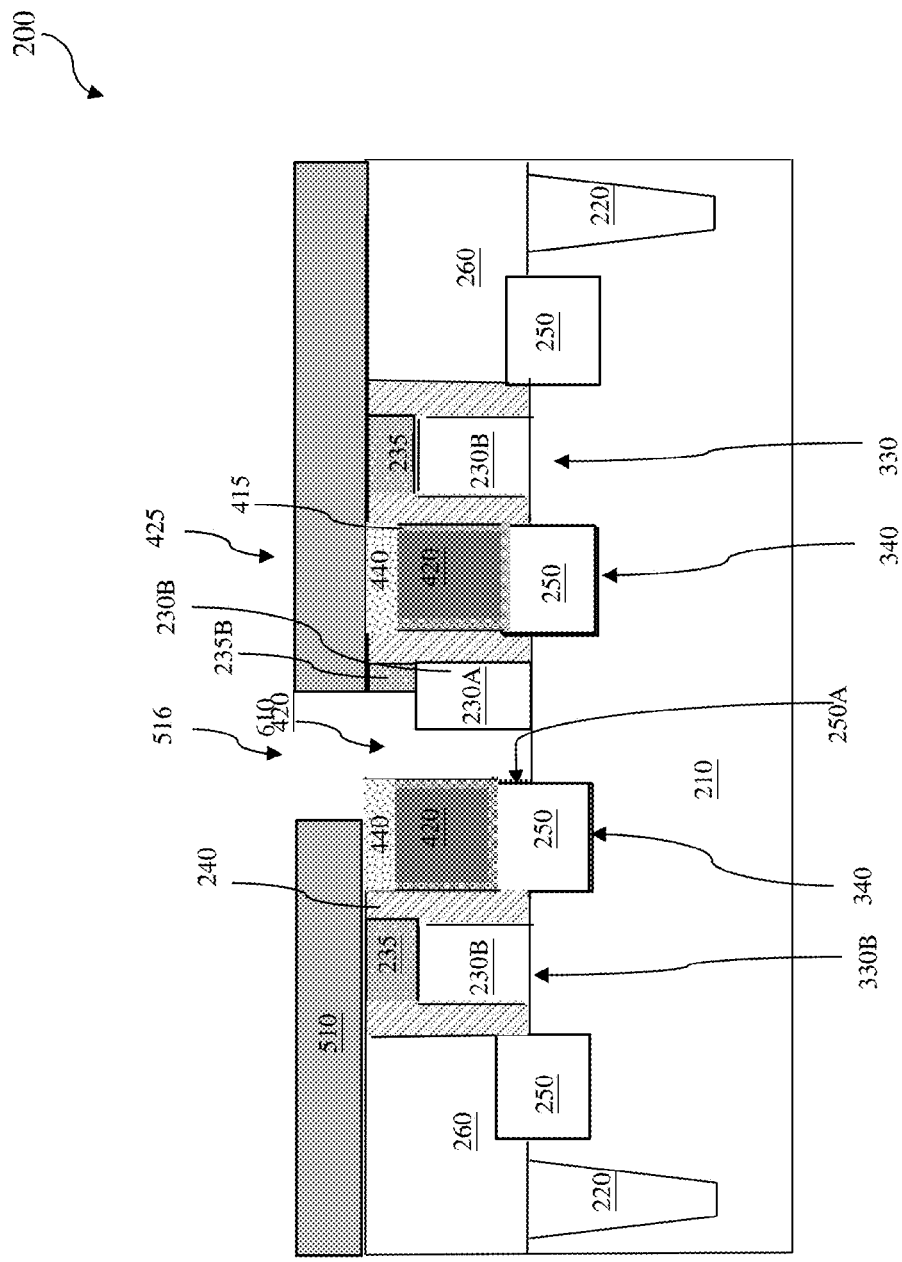

As discussed above in reference to FIG. 9B, in some embodiments, the portion of the first conductive feature 425A, as well as respective the third HM 440, is exposed within the second opening (referred to as 516 as shown in FIG. 9B). In such a scenario, the etch process is chosen to etch the first HM 235 and the sidewall spacer 240A without substantially etching the HK/MG 230A, the third HM 440 and the first conductive feature 425. As shown in FIG. 10B, in such an embodiment the exposed portion of the third HM 440 and the first conductive feature 425A within the second opening 516 serves as a sub-etch-mask during etching process to protect adjacent HK/MG 230B, as well as the sidewall spacer 240 along the adjacent HK/MG 230B. With the adequate etch selectivity, the second trench 610 is formed with a self-alignment nature, which relaxes process constrains.

Figure 10C:
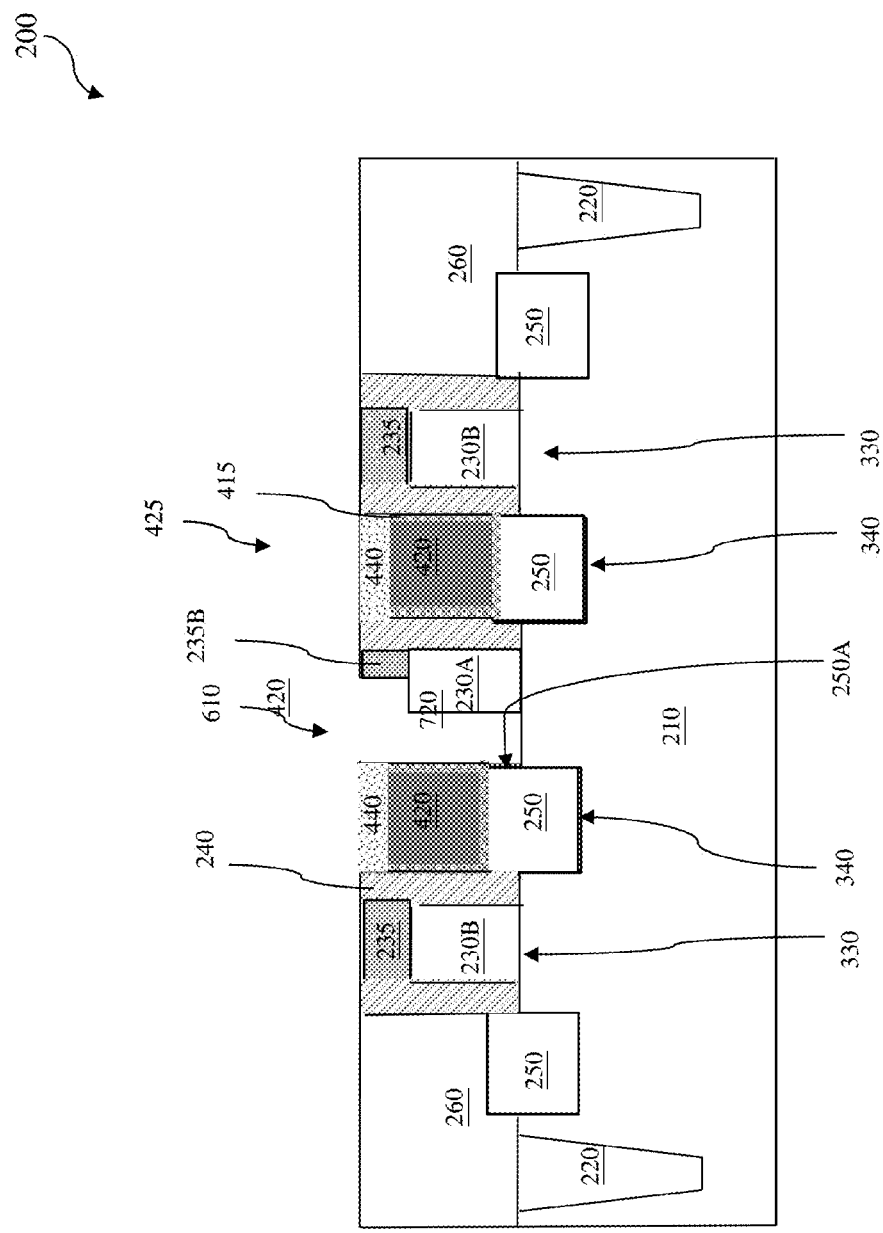

Thereafter, the embodiment described in FIG. 9A and the embodiment described in FIG. 9B proceed to remove the fourth HM 510 by other proper etching processes, as shown in FIG. 10C.

Figure 11A:
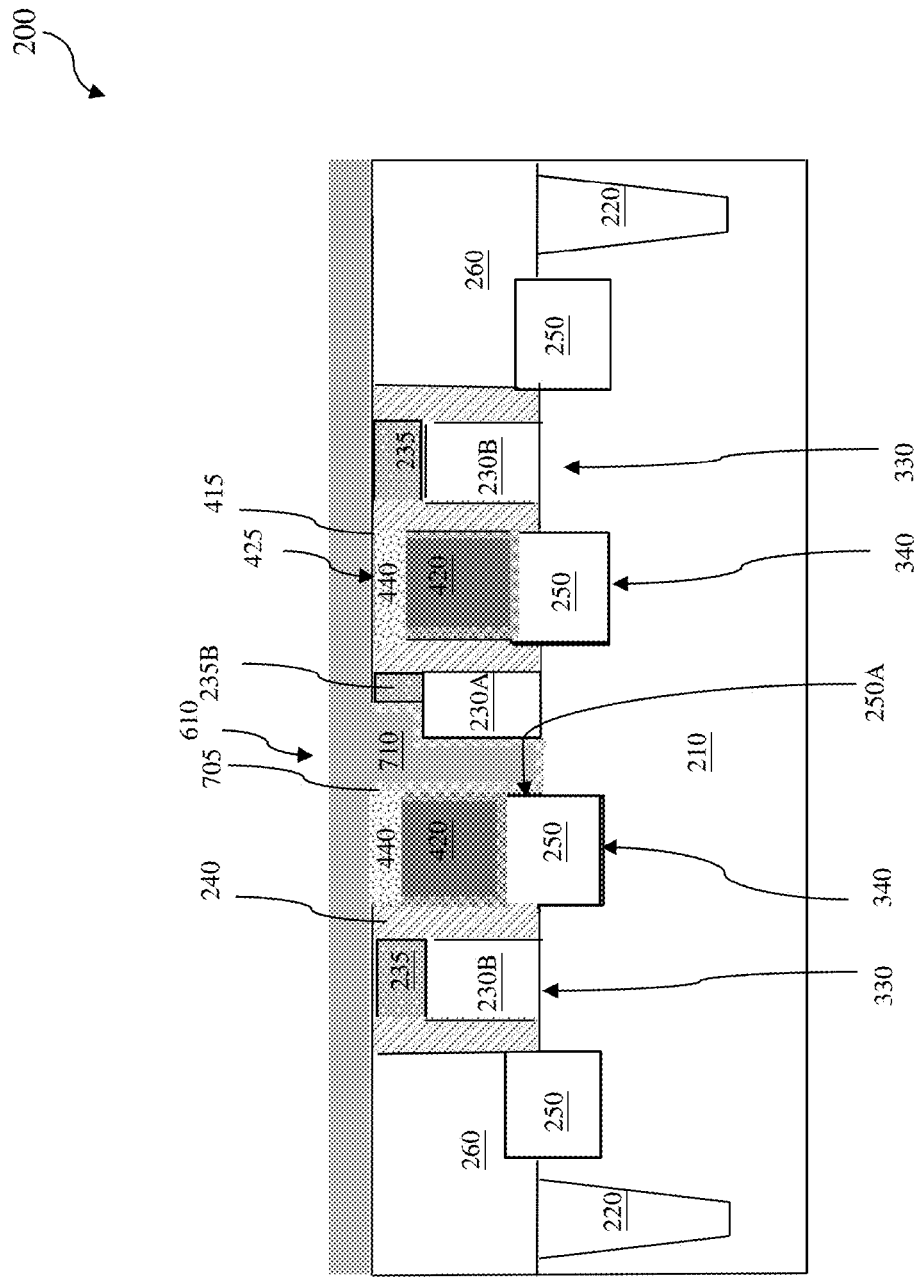

Referring to FIGS. 1 and 11A, the method 100 proceeds to step 120 by depositing a second conductive layer 710 in the second trench 610. The second conductive layer 710 may include metal layer, such as Cu, Al, W, CuMn, CuAl or CuSi, or other suitable conductive material. In some embodiments, prior to depositing the second conductive layer 710, a second barrier layer 705 is deposited in the second trench 610 to prevent out-diffusion and/or provide material adhesion. The second barrier layer 705 may include TiN, TaN, WN, TiSiN or TaSiN. The second barrier layer 705 is disposed directly along a sidewall of the exposed HK/MG 230A, along sidewall of the third HM 440, over the first barrier layer 415 along the sidewall of the first conductive feature 425 and a sidewall of the portion 250A of the S/D feature 250. In the present embodiment, the second barrier 705 and the conductive layer 710 are formed similarly in many respects to the first conductive layer 410 discussed above association with FIG. 5.

Figure 11B:
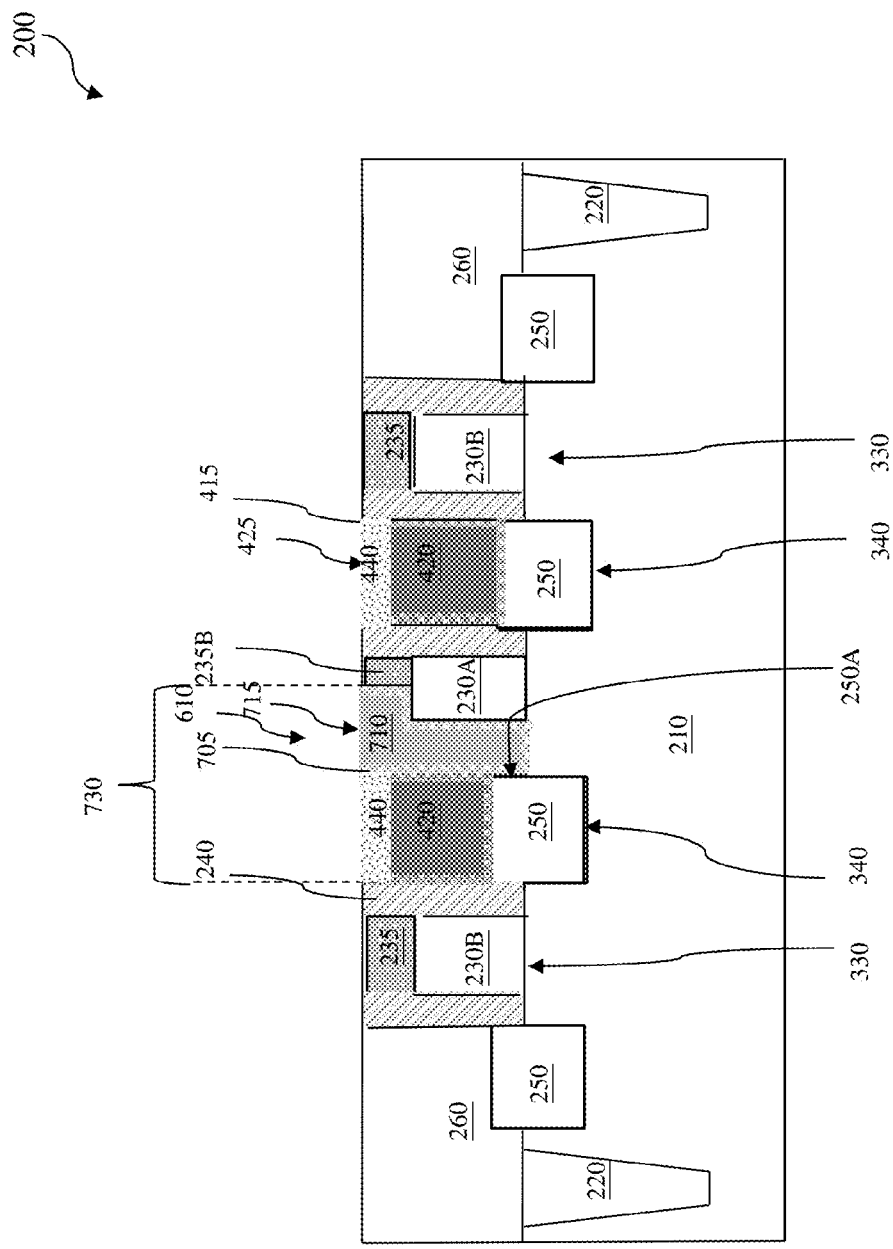

In some embodiments, a CMP process is performed to remove excessive second conductive layer 710 and the remaining second conductive layer 710 in the second trench 610 forms a second conductive feature 715, as shown in FIG. 11B. Thus, the first conductive 425 combines with the second conductive feature 715 together to provide a butted contact 730 such that a conductive connection exists between the HK/MG 230A and the respective S/D feature 250. The first barrier 415, as well as the second barrier 705, is located between the first conductive feature 425 and the second conductive feature 715.

Additional steps can be provided before, during, and after the method 100, and some of the steps described can be replaced, eliminated, or moved around for additional embodiments of the method 100.

The semiconductor devices, 200, may include additional features, which may be formed by subsequent processing. For example, various vias/lines and multilayers interconnect features (e.g., metal layers and interlayer dielectrics) are formed over the substrate 210. For example, a multilayer interconnection includes vertical interconnects, such as conventional vias or contacts, and horizontal interconnects, such as metal lines. The various interconnection features may implement various conductive materials including copper, tungsten, and/or silicide. In one example, a damascene and/or dual damascene process is used to form a copper related multilayer interconnection structure.

Based on the above, it can be seen that the present disclosure provide methods of forming a butted contact feature The method employs forming a first portion of the butted contact feature first and uses it as a sub-etch-mask to protect sidewall spacers of adjacent HK/MGs during forming a second portion of the butted contact feature. The method demonstrates suppressing MG leakage issue caused by losses of the MG and sidewall spacer during butted contact trench formation. The method also employs planarization scheme of incoming surface to improve process window. The method provides a robust butted contact formation process with self-alignment nature to relax process constrains.

The present disclosure provides many different embodiments of fabricating a semiconductor device that provide one or more improvements over existing approaches. In one embodiment, a method for fabricating a semiconductor device includes forming a first gate structure over a substrate. The first gate structure includes a gate dielectric and a gate electrode. The method also includes forming a source/drain feature in the substrate adjacent the first gate structure, forming a dielectric layer over the first gate structure and the source/drain feature, removing a portion of the dielectric layer to form a first trench exposing the first gate structure and the source/drain feature, forming a first conductive feature in the first trench, removing a first portion of the first gate structure to form a second trench. A second portion of the gate structure is exposed by the second trench while the first portion faces forward to the first conductive feature. The method also includes forming a second conductive feature in the second trench.

In yet another embodiment, a method includes providing an initial structure. The initial structure includes forming a gate stack over a substrate. The gate stack includes a gate electrode, a hard mask disposed over the gate electrode and sidewall spacers disposed along sidewalls of the gate electrode. The method also includes forming a source/drain feature in the substrate adjacent the gate stack, forming a dielectric layer over the gate stack and the source/drain feature, removing a portion of the dielectric layer to form a first trench that exposes the source/drain feature while the gate electrode is protected by the first hard mask and sidewall spacers. The method also includes forming a first conductive feature in the first trench and removing a portion of the hard mask, the sidewall spacer and the gate electrode to form a second trench. A remaining portion of the gate electrode is exposed within the second trench and a portion of a sidewall of the source and drain feature is exposed within the second trench. The method also includes forming a second conductive feature in the second trench.

In yet another embodiment, a semiconductor device includes a first gate structure disposed over a substrate. The first gate structure includes a first gate electrode and a hard mask disposed over the gate electrode. The device also includes a source/drain feature disposed in the substrate proximate the first gate structure, a first sidewall spacer disposed along a first sidewall of the first gate electrode, a first barrier layer disposed along a second sidewall of the first gate electrode. The second sidewall of the first gate electrode opposes the first sidewall of the first gate electrode and the second sidewall of the hard mask opposes the first sidewall of the hard mask. The barrier layer defines a first recess. The device also includes a first conductive feature disposed with the first recess, a second barrier layer disposed directly on the source/drain feature and defining a second recess. A portion of the second barrier physically contacts the first barrier layer. The device also includes a second conductive feature disposed with the second recess.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a first gate structure over a substrate, wherein the first gate structure includes a gate dielectric and a gate electrode;
   forming a source/drain feature in the substrate adjacent the first gate structure;
   forming a dielectric layer over the first gate structure and the source/drain feature;
   removing a portion of the dielectric layer to form a first trench exposing the first gate structure and the source/drain feature;
   forming a first conductive feature in the first trench;
   removing a first portion of the first gate structure to form a second trench, wherein a second portion of the gate structure is exposed by the second trench, wherein the first portion faces forward to the first conductive feature; and
   forming a second conductive feature in the second trench.

2. The method of claim 1, wherein the second portion of the first gate structure includes a portion of the gate dielectric and a portion of the gate electrode.

3. The method of claim 1, further comprising forming a first barrier layer in the first trench and a second barrier layer in the second trench.

4. The method of claim 3, wherein the first barrier layer physically contacts the second barrier layer.

5. The method of claim 1, further comprising forming a sidewall spacer along a sidewall of the first gate structure, and
   wherein removing the first portion of the first gate structure to form the second trench includes removing sidewall spacer formed along the sidewall of the first gate structure.

6. The method of claim 1, further comprising forming a sidewall spacer along a sidewall of the first gate structure, and
   wherein forming the first conductive feature in the first trench includes forming the first conductive feature directly on the sidewall spacer formed along the sidewall of the first gate structure.

7. The method of claim 1, further comprising forming a second gate structure over the substrate, wherein the second structure includes a gate dielectric and a gate electrode,
   wherein the source/drain feature is disposed between the first and second gate structures;
   wherein forming the dielectric layer over the first gate structure and the source/drain feature includes forming the first dielectric layer over the second gate structure;
   wherein removing the portion of the dielectric layer to form the first trench exposing the first gate structure and the source/drain feature further includes the first trench exposing the second gate structure.

8. The method of claim 7, further comprising:
   forming a patterned hard mask layer over the first conductive feature, wherein the patterned hard mask layer defines an opening that exposes a portion of the first gate structure, and
   wherein the second gate structure is covered by the patterned hard mask layer during the removing of the first portion of the first gate structure to form the second trench.

9. The method of claim 1, further comprising:
   after forming the first conductive feature in the first trench, applying a chemical mechanical polishing to planarize top surfaces of the dielectric layer, the first gate structure and the first conductive feature.

10. A method comprising:
    forming a gate stack over a substrate, wherein the gate stack includes a gate electrode, a hard mask disposed over the gate electrode and sidewall spacers disposed along sidewalls of the gate electrode;
    forming a source/drain feature in the substrate adjacent the gate stack;
    forming a dielectric layer over the gate stack and the source/drain feature;
    removing a portion of the dielectric layer to form a first trench that exposes the source/drain feature while the gate electrode is protected by the first hard mask and sidewall spacers;
    forming a first conductive feature in the first trench;
    removing a portion of the hard mask, the sidewall spacer and the gate electrode to form a second trench, wherein a remaining portion of the gate electrode is exposed within the second trench, wherein a portion of a sidewall of the source and drain feature is exposed within the second trench; and
    forming a second conductive feature in the second trench.

11. The method of claim 10, further comprising forming a first barrier layer in the first trench and a second barrier layer in the second trench.

12. The method of claim 11, wherein the first barrier layer physically contacts the second barrier layer.

13. The method of claim 10, wherein forming the first conductive feature in the first trench includes forming the first conductive feature directly on the sidewall spacer formed along the sidewall of the first gate structure.

14. The method of claim 10, further comprising forming a second gate structure over the substrate, wherein the second structure includes a gate dielectric and a gate electrode,
    wherein the source/drain feature is disposed between the first and second gate structures;
    wherein forming the first dielectric layer over the first gate structure and the source/drain feature includes forming the first dielectric layer over the second gate structure;
    wherein removing the portion of the dielectric layer to form the first trench that exposes the source/drain feature while the gate electrode is protected by the first hard mask and sidewall spacers includes the first trench exposing the second gate structure.

15. The method of claim 14, further comprising forming a patterned hard mask layer over the first conductive feature, wherein the patterned hard mask layer defines an opening that exposes a portion of the first gate structure, and wherein the second gate structure is covered by the patterned hard mask layer during the removing of the first portion of the first gate structure to form the second trench.

16. The method of claim 10, further comprising:

after forming the first conductive feature in the first trench, applying a chemical mechanical polishing to planarize top surfaces of the dielectric layer, the first gate structure and the first conductive feature.

17. The method of claim 10, wherein the second portion of the first gate structure includes a portion of the gate dielectric and a portion of the gate electrode.

18. A device comprising:

a first gate structure disposed over a substrate, the first gate structure including a first gate electrode and a hard mask disposed over the gate electrode;

a source/drain feature disposed in the substrate proximate the first gate structure;

a first sidewall spacer disposed along a first sidewall of the first gate electrode;

a first barrier layer disposed along a second sidewall of the first gate electrode, wherein the second sidewall of the first gate electrode opposes the first sidewall of the first gate electrode and the second sidewall of the hard mask opposes the first sidewall of the hard mask, wherein the barrier layer defines a first recess;

a first conductive feature having a second hard mask over it, disposed within the first recess;

a second barrier layer disposed directly on the source/drain feature and defining a second recess, wherein a portion of the second barrier physically contacts the first barrier layer; and a second conductive feature disposed with the second recess.

19. The device of claim 18, further comprising:

a second gate structure disposed over the substrate, the second structure including a second gate electrode and a second hard mask disposed over the second gate electrode, wherein the source/drain feature is disposed between the first and second gate structures; and a second sidewall spacer disposed along a third sidewall of the second gate electrode.

20. The device of claim 19, wherein a portion of the second barrier physically contacts the second sidewall spacer.

\* \* \* \* \*